United States Patent [19]

Meares

[11] 4,254,406
[45] Mar. 3, 1981

[54] INTEGRATING ANALOG-TO-DIGITAL CONVERTER

[75] Inventor: Lawrence G. Meares, Rancho Palos Verdes, Calif.

[73] Assignee: McDonnell Douglas Corporation, Long Beach, Calif.

[21] Appl. No.: 820,373

[22] Filed: Jul. 29, 1977

[51] Int. Cl.³ .......................................... H03K 13/20
[52] U.S. Cl. ........................ 340/347 NT; 340/347 M; 324/99 D
[58] Field of Search ................... 340/347 NT, 347 M; 324/99 D; 307/291, 292

[56] References Cited

U.S. PATENT DOCUMENTS

| | | | |
|---|---|---|---|
| 3,305,856 | 2/1967 | Jenkinson | 340/347 AD |
| 3,473,045 | 10/1969 | Niemann | 307/291 X |
| 3,473,053 | 10/1969 | Kardash | 307/291 |
| 3,500,109 | 3/1970 | Sugiyama et al. | 340/347 AD |
| 3,790,821 | 2/1974 | Adamson | 307/273 X |
| 3,918,050 | 11/1975 | Dorsman | 340/347 NT X |
| 3,942,172 | 3/1976 | Tucker | 340/347 NT |
| 3,955,191 | 5/1976 | Lambourn | 340/347 AD X |
| 4,005,284 | 1/1977 | Rhodes | 340/347 AD X |

OTHER PUBLICATIONS

Hnatek, A User's Handbook of D/A and A/D Converters, J. Wiley & Sons, 1976, pp. 255–262.
Hoeschele, Analog-to-Digital/Digital-to-Analog Conversion Techniques, John Wiley & Sons, Inc., 8/1968, pp. 356–358, 372, 373.
Millman et al., Pulse and Digital Circuits, McGraw-Hill Book Co., 1956, pp. 140–143, 323–327, 400–405.
Hurley, Transistor Logic Circuits, John Wiley & Sons, Inc., 1961, pp. 252–259.

Primary Examiner—Thomas J. Sloyan
Attorney, Agent, or Firm—Henry M. Bissell; Walter J. Jason; Donald L. Royer

[57] ABSTRACT

An integrating analog-to-digital converter particularly adapted to measure inertial instrument outputs for strapdown navigation. In the converter, an input signal is summed with a number of precisely quantized voltage pulses and is integrated. An error signal at the output of the integrator controls the rebalance duty cycle of the converter. Counting the net rebalance quanta over an interval results in an output count which is proportional to the input signal voltage.

10 Claims, 2 Drawing Figures

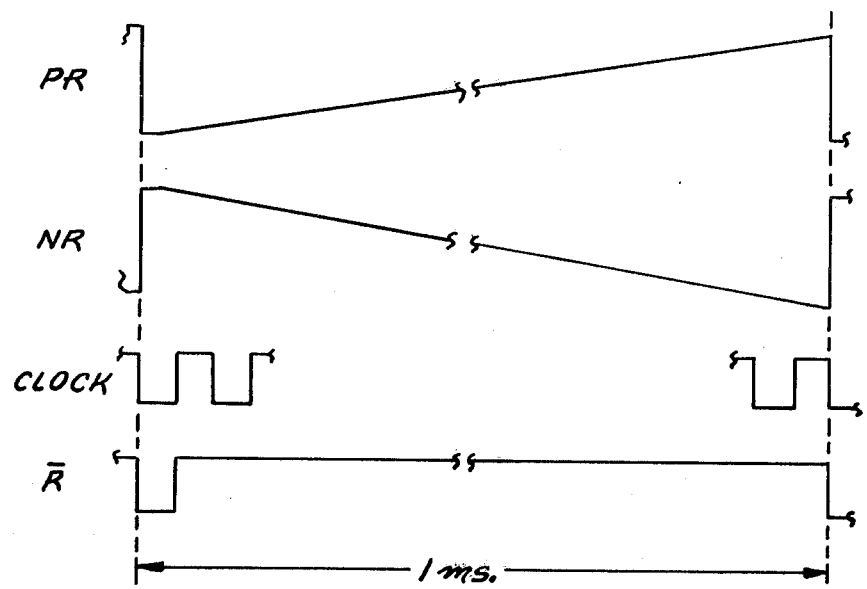
FIG_2

INTEGRATING ANALOG-TO-DIGITAL CONVERTER

BACKGROUND OF THE INVENTION

1. Field of the Invention

This invention relates to analog-to-digital (A/D) converters and, more particularly, to such converters of the integrating type.

2. Description of the Prior Art

A/D converters and their companion devices, D/A converters, are essentially interface devices for providing conversion between analog and digital signals. The D/A converter can be thought of as a digitally controlled potentiometer that produces an analog output (either voltage or current generally) that is a normalized fraction of the full-scale setting. An applied reference value is chosen to determine the full-scale output. In an A/D converter, the digital output signal, which may be considered a digital number, depends on the ratio of the quantized input to the full-scale reference.

Because an A/D converter is essentially an interface device, the basic conversion circuitry is adapted to suit particular applications. Such adaptation may include the addition of registers, buffers, a digital clock, and a reference voltage, some or all of which circuits may be provided external to the converter.

A general description of A/D converters and a number of particular circuits thereof are provided in "A User's Handbook of D/A and A/D Converters" by Eugene R. Hnatek (John Wiley & Sons 1976). The A/D converter of the present invention falls in the class of A/D converters described in said publication beginning at page 255 thereof.

Three distinct advantages of an integrating A/D converter are (a) it is a low-cost alternative to A/D converters of the pulse rebalanced type, (b) it achieves high noise immunity and high accuracy by continuous integration of the converter error signal, and (c) it permits simple, low-cost mechanization.

A particular A/D converter of this general type is disclosed in U.S. Pat. No. 3,942,172 of Tucker entitled "Bipolar Mark-Space Analogue-to-Digital Converter". The circuit disclosed therein provides for the summing of a square wave signal at the integrator input with the development of a ramp signal at the output. However, the circuit of the cited patent has an inherent error introduced because the integrator must switch current instantly because of the square wave input. Operation in this fashion causes the circuitry to lose virtual ground for a brief instant, which is a source of error in the developed signal. Moreover, the patented circuitry is limited in its utilization of the positive and negative signal sources to the integrator in that the switches to these sources are separately operated under distinct alternate control signals.

Other A/D converter circuitry of the prior art may be found, for example, in the Wasserman U.S. Pat. No. 3,368,149 entitled "Digital Voltmeter Having a Capacitor Charged by an Unknown Voltage and Discharged by a Known Voltage", the Emmerich U.S. Pat. No. 3,487,204 entitled "High Accuracy Pulse Reset Integrator", the Prozeller U.S. Pat. No. 3,541,446 entitled "Small Signal Analog to Digital Converter with Positive Cancellation of Error Voltages", and The Tippetts U.S. Pat. No. 3,404,857 entitled "Signal Generator for Control Systems". Such prior art indicates the widespread usage and development of analog-to-digital converters for a variety of particular purposes.

SUMMARY OF THE INVENTION

In brief, A/D converter circuits in accordance with the present invention comprise a differential amplifier having a capacitor feedback loop to provide operation as an integrator, an input to which an analog signal may be applied for application to the integrator, a pair of opposite polarity comparators connected to receive opposite polarity pulses provided by the integrator, and output devices connected in two separate channels to the two comparators for providing a digital output signal corresponding to the analog input signal. Switching circuitry controlled by the output signal is also provided for selectively applying to the input of the integrator reference potentials of opposite polarity to rebalance the integrator. Associated circuitry provides the required ramp signals and the reset signal used by the rebalance decision logic.

Circuitry of the present invention is particularly adaptable to a recently developed different type of gyroscope device used in the determination of instrument signals for strap-down navigation of space and other types of vehicles. Such instruments are referred to as being of the dry tuned rotor type. Prior to the recent introduction of this type of gyro, strap-down navigation systems utilized A/D converters including a pulse rebalance group in which the A/D processes were part of the instrument capture loop. With the introduction of the dry tuned rotor gyro for such purposes, it becomes desirable to separate the A/D conversion from the capture loop because the inertial instrument can be second-sourced with minimal engineering effort and also because the dry tuned rotor class of gyros does not lend itself to pulse rebalanced techniques because of the high bandwidth required to electrically damp the instrument. (The previously used floated gyros are self-damped by the flotation medium.) The electrical bandwidth of the A/D converter must exceed the nutation frequency of the gyro (175 Hz) to provide damping. This places an unachievable switching speed demand on conventional pulse rebalanced techniques.

The integrating approach to analog-to-digital conversion allows the gyro to have an analog capture loop, making it a rate instrument. The rate signal is converted back to an incremental angle by continuously integrating the difference between the rate signal and a series of precisely quantized pulses which represent the incremental angle of rotation. The A/D bandwidth is then independent of the gyro bandwidth so that speed and accuracy can be optimized to meet system, rather than gyro, requirements. Continuous integration rather than sampling techniques allows A/D converter resolution to increase linearly with the integration interval. Integration also allows for processing of all the rate information so that sampling errors are not introduced for inertial applications. The accuracy of this technique when viewed as a voltage measurement exceeds that of sampling techniques when applied to a noisy signal. Both techniques reduce signal noise by the square root of the measurement interval; however, quantizing noise in the integrating technique is reduced linearly with time, while in the sampled case the reduction is only by the square root of the interval.

The integrating A/D converter of the present invention is not only useful for inertial instrument measurement as shown and described herein; it is also useful for precision voltage measurement of a more general nature. Testing of circuitry embodying the invention has shown that its accuracy, dynamic range and stability are comparable to or better than the best available commercial equipment.

BRIEF DESCRIPTION OF THE DRAWING

A better understanding of the present invention may be had from a consideration of the following detailed description, taken in conjunction with the accompanying drawing, in which:

FIG. 2 is a diagram of various control waveforms employed in the arrangement of FIG. 1.

DESCRIPTION OF THE PREFERRED EMBODIMENT

Figure 1:
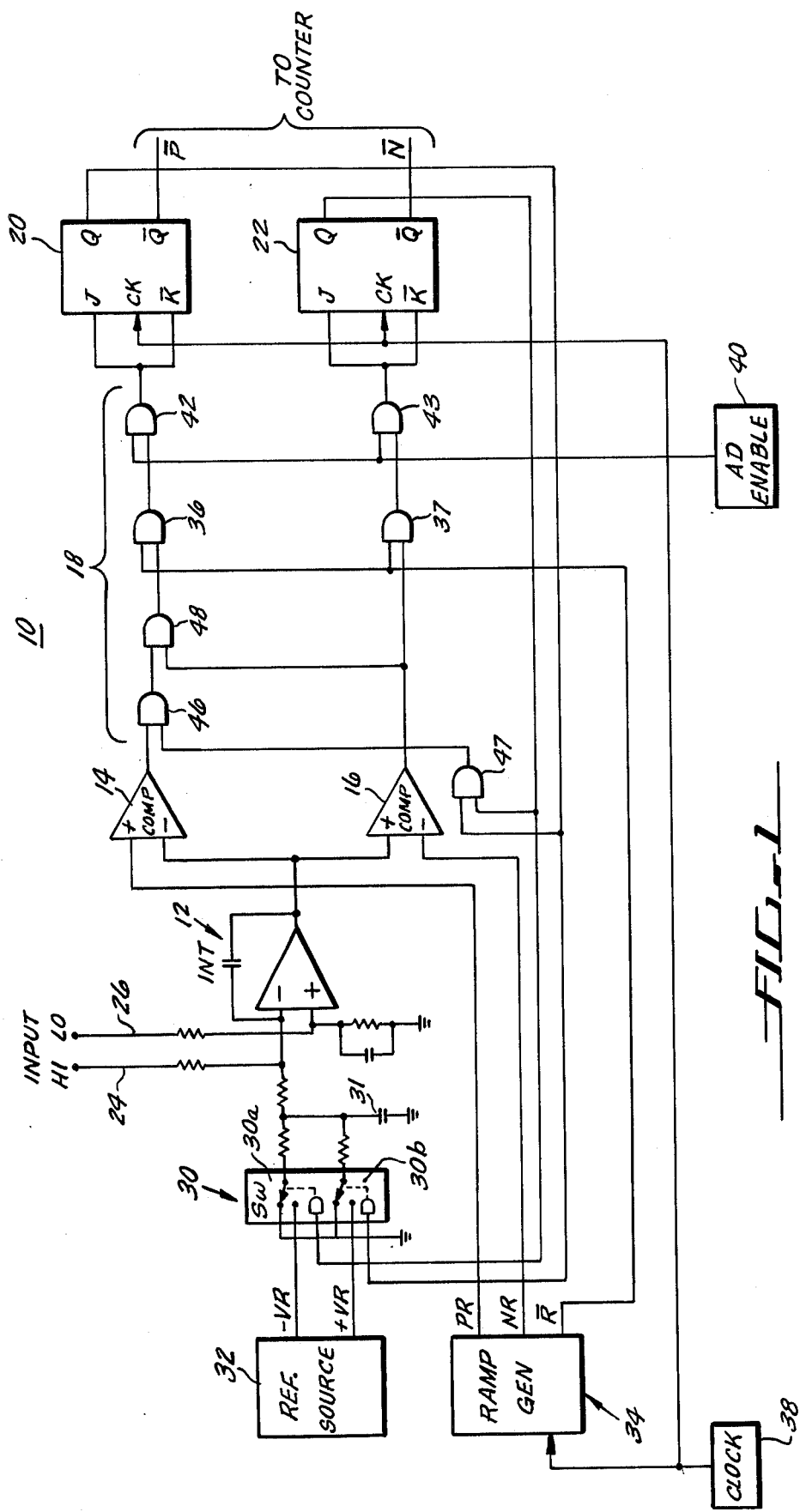
FIG. 1 is a simplified block diagram of the preferred embodiment of the invention.

As indicated in FIG. 1, an A/D converter 10 is shown comprising an integrator 12, a pair of comparators 14, 16 coupled to the output of the integrator 12, a logic section 18, and a pair of J-K flip-flops 20, 22. An input analog signal to be measured by the A/D converter 10 is applied via leads 24, 26 (marked input "HI" and "LO") to the input of the integrator 12. This input signal may be of either polarity. After processing, the output signal is taken from the $\bar{Q}$ output of whichever flip-flop 20 or 22 corresponds to the polarity of the input signal as measured. If the signal is positive, the output of the flip-flop 22, designated $\bar{N}$, is available as a pulse of duration corresponding to the amplitude of the positive input analog signal. If the input signal is negative, the $\bar{Q}$ output of the flip-flop 20 is available as a pulse on the $\bar{P}$ lead of duration corresponding to the magnitude of the negative input signal. The $\bar{P}$ and $\bar{N}$ signals are applied to a counter which counts over the interval of the $\bar{P}$ or $\bar{N}$ signals, thereby providing an output digital count which is proportional to the input voltage and with an indication of polarity.

The input of the integrator 12 is coupled via electronic switches 30 to a reference source 32 which provides negative and positive VR levels (reference voltages). The switches 30 are responsive to the Q outputs of the flip-flops 20 and 22, respectively, the high signal from the flip-flop 20 causing the switch 30b to transfer from ground to reference voltage +VR, and the switch 30a operating similarly with respect to the Q signal from the flip-flop 22 and the negative voltage reference, −VR. A filter capacitor 31 connected to ground from the common output node of the switch 30 serves to reduce the harmonic content of the rebalance pulses in order to prevent integrator effect on switches of signal level, thus avoiding the non-linearity which would otherwise be produced in the error signal.

A ramp generator 34 is included which generates a positive going ramp signal PR, applied to the comparator 14, a negative-going ramp signal NR which is applied to the comparator 16, and a reset signal $\bar{R}$ which is applied to a pair of reset gates 36, 37 in the logic section 18 under the control of a clock signal from a clock 38. The clock signal is also applied as a quantizing signal to the flip-flops 20, 22. An AD Enable block 40 controls a pair of enable gates 42, 43 in the logic section 18 to block the operation of the A/D converter for a limited period to permit transfer of data to a computer input buffer of associated circuitry (not shown) in the overall system in which the A/D converter 10 is employed. In addition the logic section 18 includes a pair of anti-coincidence gates 46, 47 and an interlock gate 48.

FIG. 2 illustrates the waveforms for the positive and negative ramp signals, the clock, and the reset signal over a period of one millisecond, which is selected as the duration of a conversion or limit cycle for the A/D converter 10 of FIG. 1. The exact quantizing frequency (clock pulse frequency) for the system is 32 KHz. Thus, each rebalance interval or quantum is 31.25 microseconds. As indicated, the positive and the negative ramp signals and the reset signal are developed by the ramp generator 34 as timed by the clock 38. The reset signal is a single negative pulse at the beginning of the one-millisecond limit cycle in coincidence with the negative going pulse of the clock waveform. In the circuit of FIG. 1, the reset pulse applied to the reset gates 36, 37 causes both flip-flops 20, 22 to be turned on simultaneously at the beginning of each one-millisecond interval. This arranges the output signals $\bar{P}$ and $\bar{N}$ so that the associated counter, in counting the rebalance quanta, is always counting from turn-off edge to turn-off edge, and any variations in the timing of the turn-on points, which might result from the failure of the rise and fall times of the flip-flops to match, are cancelled out. The beneficial result of this particular arrangement is an improvement in overall linearity.

The arrangement of the anti-coincidence gates 46, 47 forces the limit cycle to occur. The gate 46 is in the positive line between the comparator 14 and the flip-flop 20, and is controlled by the gate 47 which is coupled to both of the high outputs of the flip-flops 20, 22. This arrangement insures that the positive and negative (P and N) signals are prohibited from turning off at the same time. When both Q outputs of flip-flops 20, 22 are high, gate 47 inhibits gate 46 so that no pulses can pass from the positive comparator 14 to the positive flip-flop 20. Thus only the negative flip-flop 22 may be turned off when both flip-flops are on. This arrangement compensates for the fact that the separate positive and negative reference signals (+VR and −VR) are not exactly balanced, a situation which would otherwise provide scale factor asymmetry. The anti-coincidence gating arrangement forces the system to be linear around null so that noise around the null point will not cause bias rectification and develop DC error. When operating in this fashion, the anti-coincidence gate circuit avoids zero-offset error.

The PR and NR ramps are generated separately in the ramp generator 34 for application to the comparators 14 and 16, respectively, to avoid the deficiencies otherwise present at the output of the integrator 12 where a square wave is applied to the input of an A/D converter integrator, such as in prior U.S. Pat. No. 3,942,172. In the circuit of that patent, the square wave summing at the integrator input develops a ramp waveform at the output, but error is introduced because of the switching by the square wave. During such switching, there is loss of virtual ground for an instant which introduces effective interference at the comparators.

In operation of the circuit of FIG. 1, the converter is used as an integrating incremental voltage measuring device. An input signal is summed with a number of precisely quantized voltage pulses and is integrated. The error signal at the output of the integrator controls the rebalance duty cycle. Counting the net rebalance quanta over the limit cycle interval results in an output proportional to the input voltage. The process of continuous integration as provided by circuits in accordance with the present invention, as opposed to sampling techniques, is important for the particular use in an inertial navigation system for which the disclosed circuit has been designed because each quantum can be interpreted as an incremental angle or velocity, depending on the type of instrument being measured. In a strict voltage measuring sense, the integration process reduces quantizing noise by the square root of the total measurement interval more than a similar sampling converter.

The noise at the input to the A/D converter of FIG. 1 is about 3% of full scale, so that positive and negative rebalance signals must be utilized 3% of the time, on the average. This results in a bias error of at least 3% of the difference in the magnitude of the positive and the negative reference quanta. By introducing a third rebalance state of zero magnitude through the application of the reset signal at the reset gates 36, 37 as described, the dynamic range (taken on the ratio of full scale to bias error) is extended by a factor of 30. In the inertial navigation application of the present invention, the null state must be guaranteed in the presence of noise for about 97% of the time. This is accomplished by limiting the occurrence of the rebalance decision to one of each 32 quanta (one per limit cycle). The null state is forced by utilizing the ramp voltages which intercept the integrator error signal at the time when the rebalance pulses are to be turned off.

The logic provided in the logic section 18 of the circuit of FIG. 1 also forces a limit cycle of 500 Hz to prevent simultaneous switching off of the P and N reference signals due to a crosstalk peculiar to the integrated circuit switch 30 which is used in the specific hardware and to eliminate bias rectification. It is convenient in the redundant inertial measurement system in which the converter of FIG. 1 is utilized to prevent conversion during a short time when data are being transferred to the computer input buffer. This is accomplished by using the enable signal from the A/D Enable stage 40 to block the enable gates 42, 43, thereby turning off the rebalance pulses in the positive and negative lines to the flip-flops 20, 22, to allow the integrator 12 to "remember" the error developed.

As a result of causing both P and N rebalance each millisecond, the circuit effectively removes that error which would otherwise develop by virtue of the fact that the width of a single pulse does not necessarily equal the quantizing period due to differences in turn-on and turn-off characteristics of the flip-flops 20, 22. This procedure is considered preferable to an alternative possibility of switching the signals off for a short time in each 32-microsecond interval because such a procedure would impact the scale factor accuracy each 32 microseconds, rather than once in each millisecond for the procedure here adopted.

Although there has been described above one specific arrangement of an integrating A/D converter in accordance with the invention for the purpose of illustrating the manner in which the invention may be used to advantage, it will be appreciated that the invention is not limited thereto. Accordingly, any and all modifications, variations or equivalent arrangements which may occur to those skilled in the art should be considered to be within the scope of the invention as defined in the appended claims.

What is claimed is:

1. Analog-to-digital converter apparatus comprising:
   an integrator coupled to receive input analog signals to be converted to digital representations;
   comparator means coupled to the integrator for receiving an error signal therefrom and having an output line for supplying the result of a comparison of the error signal with an applied reference signal;
   flip-flop means responsive to signals from the comparator means for providing digital incremental time duration outputs corresponding to the analog signals, the flip-flop means having an input terminal and including internal circuitry making up a J-K flip-flop;
   means coupled to the flip-flop means for digitizing an incremental time duration output from the flip-flop means to provide an output digital indication of the magnitude and polarity of a corresponding input analog signal;
   a voltage reference source;
   switching means responsive to an output of the flip-flop means for selectively applying reference potentials from the reference source to the integrator;
   logic circuitry coupled between the comparator means output line and the input terminal of the flip-flop means for selectively controlling the application of signals from the comparator means to the flip-flop means input terminal; said logic circuitry including a logic gate for both directing an error signal from the comparator means to the flip-flop means and directing a reset signal to the flip-flop means; and
   separate ramp generating means including a ramp generator for generating ramp signals for application to the comparator means for comparison with the error signal from the integrator.

2. Analog-to-digital converter apparatus comprising:
   an integrator coupled to receive input analog signals to be converted to digital representations;
   comparator means coupled to the integrator for receiving an error signal therefrom;
   flip-flop means responsive to signals from the comparator means for providing digital incremental time duration outputs corresponding to the analog signals;
   means coupled to the flip-flop means for digitizing an incremental time duration output from the flip-flop means to provide an output digital indication of the magnitude and polarity of a corresponding input analog signal;
   a voltage reference source;
   switching means responsive to an output of the flip-flop means for selectively applying reference potentials from the reference source to the integrator; and
   separate ramp generating means including a ramp generator for generating ramp signals for application to the comparator means for comparison with the error signal from the integrator; wherein the analog signal may be of either polarity and wherein the comparator means and the flip-flop means each comprise dual means for operating respectively with positive and negative signals from the integrator, the reference source providing positive and negative reference potentials, and the ramp generator providing positive and negative ramp signals for application to respective ones of the dual comparator means.

3. The apparatus of claim 2 wherein the switching means comprises a pair of electronic switches respectively coupled to be controlled by a first output of corresponding ones of the dual flip-flop means to connect the integrator selectively to ground or to a reference potential from the reference source.

4. The apparatus of claim 1 further comprising a clock signal generator coupled to the flip-flop means and to the ramp generator to synchronize the switching of the flip-flop means and the initiation of the ramp signals generated by the ramp generator.

5. The apparatus of claim 4 wherein the ramp generator further includes means for generating a reset signal for controlling the logic gate to initiate a limit cycle for the converter in synchronization with a clock signal and the ramp signals from the ramp generator.

6. The apparatus of claim 5 wherein the reset signal and logic gate are operative to turn on the flip-flop means simultaneously at the beginning of each limit cycle.

7. Apparatus of claim 1 wherein the logic circuitry includes enable gating means responsive to an enable signal for blocking the switching of the flip-flop means during a predetermined interval.

8. The apparatus of claim 2 further comprising logic circuitry coupled between the comparator means and the flip-flop means for selectively controlling the application of signals from the comparator means to the flip-flop means; and wherein the logic circuitry further includes an interlocking gate connected between one of the comparator means and a corresponding flip-flop means and controlled by the output of the other comparator means for selectively controlling the switching of said corresponding flip-flop means.

9. The apparatus of claim 2 also including logic circuitry coupled between the comparator means and the flip-flop means for selectively controlling the application of signals from the comparator means to the flip-flop means; and wherein the logic circuitry further comprises anti-coincidence gating means for preventing the turning off of the dual flip-flop means simultaneously.

10. The apparatus of claim 9 wherein said anticoincidence gating means comprises a first gate connected in series between one of the comparator means and a corresponding flip-flop means, and a second gate coupled to control the first gate, the second gate having a pair of inputs coupled respectively to the outputs of first and second ones of the flip-flop means.

* * * * *